(12) United States Patent
Noh et al.

(10) Patent No.: US 10,516,099 B2
(45) Date of Patent: Dec. 24, 2019

(54) ELECTRONIC DEVICE AND METHOD FOR FABRICATING THE SAME

(71) Applicant: SK hynix Inc., Icheon-Si (KR)

(72) Inventors: Seung-Mo Noh, Icheon-si (KR); Yang-Kon Kim, Incheon-Si (KR); Ku-Youl Jung, Icheon-si (KR); Bo-Mi Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 564 days.

(21) Appl. No.: 15/164,304

(22) Filed: May 25, 2016

(65) Prior Publication Data

US 2017/0117457 A1    Apr. 27, 2017

(30) Foreign Application Priority Data

Oct. 23, 2015 (KR) .................. 10-2015-0148068

(51) Int. Cl.
*H01L 43/02*     (2006.01)
*H01F 10/32*     (2006.01)
(Continued)

(52) U.S. Cl.
CPC .............. *H01L 43/10* (2013.01); *G06F 3/061* (2013.01); *G06F 3/0659* (2013.01); *G06F 3/0661* (2013.01); *G06F 3/0685* (2013.01); *G06F 13/28* (2013.01); *G06F 13/4282* (2013.01); *G11C 11/161* (2013.01); *H01L 43/02* (2013.01); *H01L 43/08* (2013.01); *G11C 11/005* (2013.01); *H01L 27/222* (2013.01); *H01L 43/12* (2013.01)

(58) Field of Classification Search
CPC ........ H01L 43/08; H01L 43/10; H01L 27/222
See application file for complete search history.

(56) References Cited

U.S. PATENT DOCUMENTS 6,849,465 B2 * 2/2005 Park ...................... H01L 43/12
                                                                257/295
8,786,039 B2   7/2014 Apalkov et al.
(Continued)

FOREIGN PATENT DOCUMENTS

CN          104993046        10/2015
KR       10-0890323 B1        3/2009
(Continued)

OTHER PUBLICATIONS

Office Action for Taiwanese Patent Application No. 105114195, dated Mar. 20, 2019 (12 pages).
(Continued)

*Primary Examiner* — Bradley Smith
*Assistant Examiner* — David J Goodwin
(74) *Attorney, Agent, or Firm* — Perkins Coie LLP

(57) ABSTRACT

An electronic device and a method for fabricating the same are provided. An electronic device according to an implementation of the disclosed technology is an electronic device including a semiconductor memory, wherein the semiconductor memory includes a magnetic tunnel junction (MTJ) structure including: a free layer having a changeable magnetization direction; a pinned layer having a pinned magnetization direction; and a tunnel barrier layer sandwiched between the free layer and the pinned layer, wherein the free layer includes a CoFeAlB alloy.

15 Claims, 10 Drawing Sheets

(51) Int. Cl.
  *G11C 11/16* (2006.01)
  *H01L 43/10* (2006.01)
  *G06F 3/06* (2006.01)
  *G06F 13/28* (2006.01)
  *G06F 13/42* (2006.01)
  *H01L 43/08* (2006.01)
  *H01L 27/22* (2006.01)
  *H01L 43/12* (2006.01)
  *G11C 11/00* (2006.01)

(56) References Cited

U.S. PATENT DOCUMENTS

| | | | |
|---|---|---|---|
| 8,865,326 B2 | 10/2014 | Fukumoto et al. | |
| 9,972,777 B1* | 5/2018 | Haq | H01L 43/12 |
| 2014/0308759 A1 | 10/2014 | Kim et al. | |
| 2015/0048464 A1* | 2/2015 | Park | G11C 11/161 257/421 |
| 2015/0129996 A1* | 5/2015 | Tang | H01L 43/12 257/427 |
| 2017/0154661 A1* | 6/2017 | Moon | G06F 3/061 |
| 2017/0155040 A1 | 6/2017 | Noh | |
| 2017/0345999 A1* | 11/2017 | Noh | H01F 10/16 |

FOREIGN PATENT DOCUMENTS

| | | |
|---|---|---|
| KR | 10-2014-0131136 A | 11/2014 |
| KR | 10-2017-0064054 | 6/2017 |
| TW | 201444135 | 11/2014 |

OTHER PUBLICATIONS

Office action for Chinese Patent Application No. 201610452847.2, dated Jun. 4, 2019 (16 pages).

* cited by examiner

ELECTRONIC DEVICE AND METHOD FOR FABRICATING THE SAME

CROSS-REFERENCE TO RELATED APPLICATIONS

The present application claims priority of Korean Patent Application No. 10-2015-0148068, entitled "ELECTRONIC DEVICE AND METHOD FOR FABRICATING THE SAME" and filed on Oct. 23, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which the characteristics of a variable resistance element can be improved.

In an implementation, an electronic device including a semiconductor memory is provided wherein the semiconductor memory includes a magnetic tunnel junction (MTJ) structure including: a free layer having a changeable magnetization direction; a pinned layer having a pinned magnetization direction; and a tunnel barrier layer sandwiched between the free layer and the pinned layer, wherein the free layer includes a CoFeAlB alloy.

Implementations of the above electronic device may include one or more the following.

A content of Al in the CoFeAlB alloy is less than 10%. The content of Al in the CoFeAlB alloy is 5% or more. The semiconductor memory further comprises a bottom layer disposed under the MTJ structure and serving to increase a perpendicular magnetic crystalline anisotropy of a layer located over the bottom layer. The bottom layer comprises AlN. The semiconductor memory further comprises a magnetic correction layer that reduces an effect of a stray magnetic field produced by the pinned layer. The magnetic correction layer is disposed over the MTJ structure. The semiconductor memory further comprises a spacer layer sandwiched between the MTJ structure and the magnetic correction layer and comprising a noble metal. The semiconductor memory further comprises one or more layers disposed over or under the MTJ structure and having a sidewall aligned with a sidewall of the MTJ structure. A sidewall of the bottom layer is not aligned with a sidewall of the MTJ structure. A width of a top surface of the bottom layer is larger than a width of a bottom surface of the MTJ structure.

In an implementation, an electronic device including a semiconductor memory is provided wherein the semiconductor memory includes a magnetic tunnel junction (MTJ) structure including: a free layer having a changeable magnetization direction; a pinned layer having a pinned magnetization direction; and a tunnel barrier layer sandwiched between the free layer and the pinned layer, wherein the free layer comprises a CoFeXB alloy, wherein X in the CoFeXB alloy is a metal that decreases a damping constant of the free layer while having a content that increases perpendicular anisotropy field of the free layer.

In the implementation, the semiconductor memory further comprises a bottom layer disposed under the MTJ structure and comprising a nitride of X.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, a method for fabricating an electronic device including a semiconductor memory includes forming over a substrate a magnetic tunnel junction (MTJ) structure including: providing a substrate; and forming a magnetic tunnel junction (MTJ) structure over the substrate to include: a free layer having a changeable magnetization direction and including a CoFeAlB alloy; a pinned layer having a pinned magnetization direction; and a tunnel barrier layer sandwiched between the free layer and the pinned layer.

Implementations of the above method may include one or more the following.

To provide the free layer including the CoFeAlB alloy, the forming of the MTJ structure comprises: depositing a CoFeB layer over the substrate; depositing an Al layer; and performing heat treatment. A ratio of a thickness of the Al layer to a thickness of the CoFeB layer is less than 1/9. The depositing of the Al layer is performed before or after the depositing of the CoFeB layer. The method further comprising repeating the depositing of the Al layer and the depositing of the CoFeB layer. The forming of the the MTJ structure includes performing physical deposition using a CoFeAlB alloy target to provide the free layer including the CoFeAlB alloy. The forming of the MTJ structure includes performing physical deposition using both a CoFeB target and an Al target to provide the free layer including the CoFeAlB alloy.

These and other aspects, implementations and associated advantages are described in greater detail in the drawings, the description and the claims.

DETAILED DESCRIPTION

Figure 1:
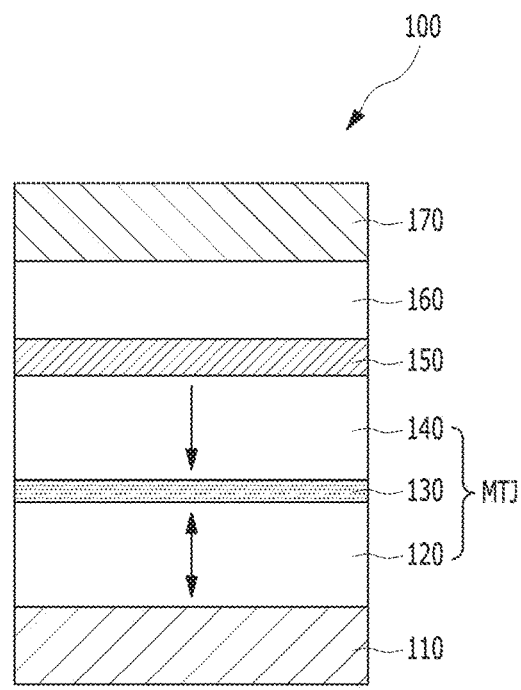
FIG. 1 is a cross-sectional view illustrating a variable resistance element according to an implementation of the disclosed technology.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

As used herein, the term "variable resistance element" refers to an element capable of switching between different resistance states according to a voltage or current applied to both ends thereof. The variable resistance element may store different data according to its resistance state. Thus, the variable resistance element may function as a memory cell. The memory cell may further include, in addition to the variable resistance element, a selection element connected to the variable resistance element and serving to control access to the variable resistance element. Such memory cells may be arranged in various ways to form a semiconductor memory.

As an example, the variable resistance element may include a magnetic tunnel junction (MTJ) structure including: a free layer having a changeable magnetization direction; a pinned layer having a pinned magnetization direction; and a tunnel barrier layer sandwiched between the free layer and the pinned layer. In this variable resistance element, the magnetization direction of the free layer may change according to a voltage or current applied so that it can change to a direction parallel or antiparallel to the magnetization direction of the fixing layer. Thus, the variable resistance element can switch between a low-resistance state and a high-resistance state. Implementations as described below are intended to provide an improved variable resistance element capable of satisfying or enhancing various characteristics required for the above-described variable resistance element.

FIG. 1 is a cross-sectional view illustrating a variable resistance element according to an implementation of the disclosed technology.

Referring to FIG. 1, a variable resistance element 100 according to an implementation of the disclosed technology may include a magnetic tunnel junction (MTJ) structure including: a free layer 120 having a changeable magnetization direction; a pinned layer 140 having a pinned magnetization direction; and a tunnel barrier layer 130 sandwiched between the free layer 120 and the fixed layer 140.

The free layer 120 has a changeable magnetization direction, and thus is capable of storing different data. It may also be referred as a storage layer or the like. The magnetization direction of the free layer 120 may be substantially perpendicular to the surface of the free layer. In other words, the magnetization direction of the free layer 120 may be substantially parallel to the direction in which the free layer 120, the tunnel barrier layer 130 and the pinned layer 140 are stacked on one another. Thus, the magnetization direction of the free layer 120 is variable between a downward direction and an upward direction. A change in the magnetization direction of the free layer 120 can be induced by spin transfer torque. In this implementation, the free layer may include a CoFeAlB alloy that is a ferromagnetic material. In some implementations, the content of Al in the CoFeAlB alloy may be less than 10%. Various advantages can be provided by having the free layer 120 that includes a CoFeAlB alloy.

The pinned layer 140 has a pinned magnetization direction which contrasts with the magnetization direction of the free layer 120, and may be referred to as a reference layer or the like. Although FIG. 1 illustrates that the pinned layer 140 has a downward magnetization direction, the pinned layer 140 may also have an upward magnetization direction. The pinned layer 140 may have a single-layer or multilayer structure including a ferromagnetic material. For example, the pinned layer 140 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, an Fe—Pd alloy, a Co—Pd alloy, a Co—Pt alloy, an Fe—Ni—Pt alloy, a Co—Fe—Pt alloy, or a Co—Ni—Pt alloy, or the like, or may include a stack of metals, such as Co/Pt, or Co/Pd or the like.

The tunnel barrier layer 130 allows the tunneling of electrons in a write operation for storing data, making it possible to change the magnetization direction of the free layer 120. The tunnel barrier layer 130 may include a dielectric oxide, for example, an oxide such as MgO, CaO, SrO, TiO, VO, or NbO or the like.

If a voltage or current is applied to the top and bottom of the variable resistance element 100 in the above-described MTJ structure, the magnetization direction of the free layer 120 can be changed by spin transfer torque. If the magnetization direction of the free layer 120 is parallel to the magnetization direction of the pinned layer 140, the variable resistance element 100 may be in a low-resistance state and may store, for example, data '1'. On the contrary, if the magnetization direction of the free layer 120 is antiparallel to the magnetization direction of the pinned layer 140, the variable resistance element 100 may be in a high-resistance state and may store, for example, data '0'. In addition, the positions of the free layer 120 and the pinned layer 140 may be reversed. For example, the pinned layer 140 may be located below the tunnel barrier layer 130, and the free layer 120 may be located over the tunnel barrier layer 130.

Various advantages of the use of the CoFeAlB alloy as the free layer 120 in this implementation will now be described in further detail with reference to FIG. 2A to FIG. 4.

Figure 2A:
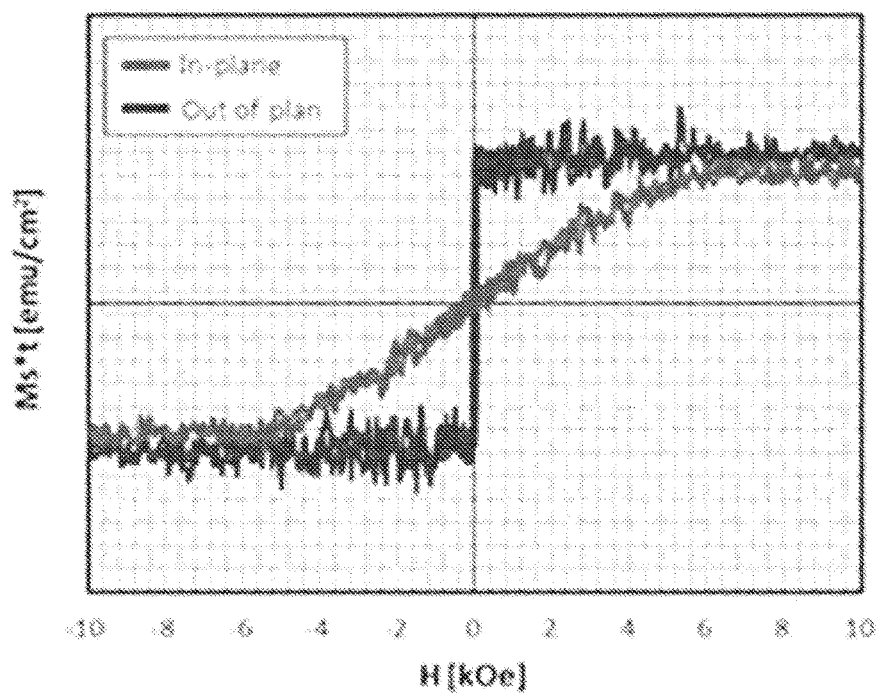
FIG. 2A is a graph showing a hysteresis loop of a variable resistance element including a magnetic tunnel junction (MTJ) structure according to a comparative example.
Figure 2B:
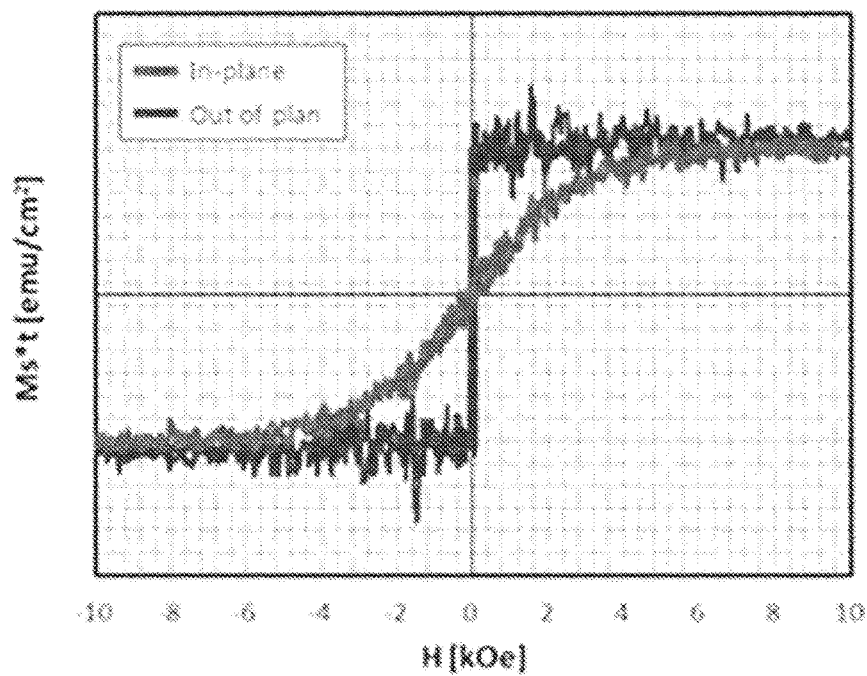
FIG. 2B is a graph showing a hysteresis loop of a variable resistance element including an MTJ structure according to an implementation of the disclosed technology.

FIG. 2A is a graph showing a hysteresis loop of a variable resistance element including a magnetic tunnel junction (MTJ) structure according to a comparative example, and FIG. 2B is a graph showing the hysteresis loop of a variable resistance element including an MTJ structure according to this implementation.

The MTJ structure according to the comparative example includes a CoFeB alloy as a free layer, and the MTJ structure according to this implementation includes, as a free layer, a CoFeAlB alloy having an Al content of less than 10%.

Referring to FIGS. 2A and 2B, the comparative example and this implementation show similar perpendicular magnetization characteristics. In other words, the perpendicular magnetization characteristics of the free layer are not affected when using the CoFeAlB for the free layer instead of the CoFeB that is mainly used as a free layer.

Figure 3:
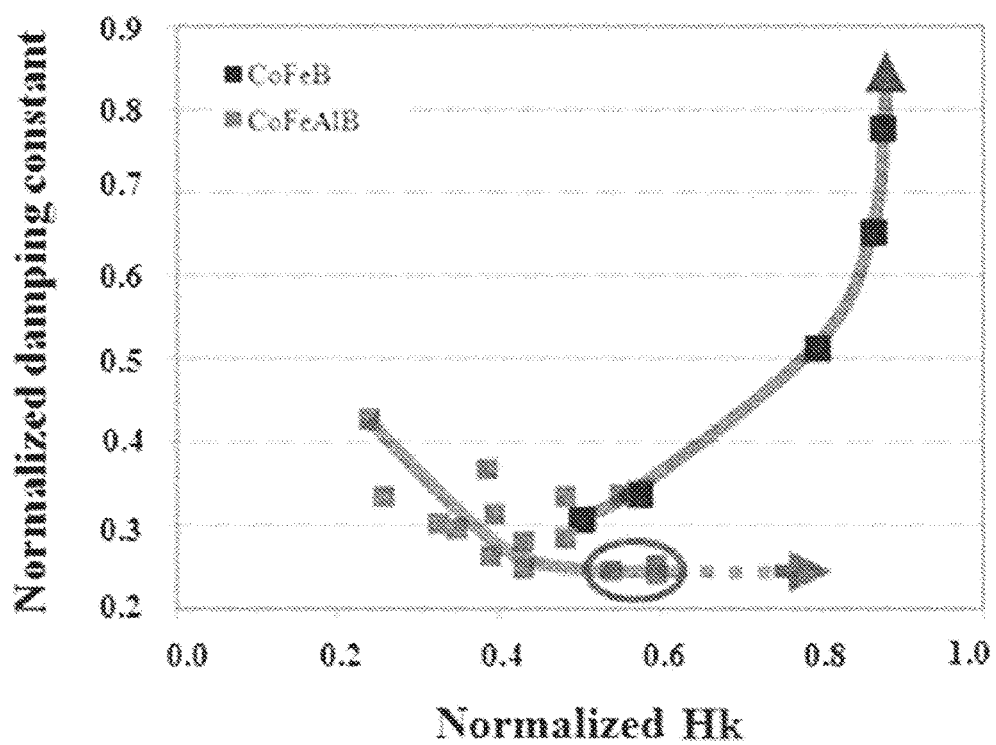
FIG. 3 shows graphs of damping constants of a free layer according to a comparative example and an implementation of the disclosed technology.

FIG. 3 shows two graphs of the damping constants of the free layer according to the comparative example and one implementation of the disclosed technology. In FIG. 3, the x-axis represents normalized Hk (perpendicular anisotropy field) values, and the y-axis represents normalized damping constant values. The free layer of the comparative example includes a CoFeB alloy, and the free layer of this implementation includes a CoFeAlB alloy.

Referring to FIG. 3, in the case of the CoFeB alloy, there is a problem in that the damping constant value increases as the Hk value increases, that is, the perpendicular magnetic anisotropy increases. On the contrary, in the case of the CoFeAlB alloy, it can be seen that the damping constant value decreases, when the Hk value increases. Thus, at an Hk value equal to or higher than a certain level, the CoFeAlB alloy may have a damping constant value lower than that of the CoFeB alloy. As will be discussed below, the damping constant value relates to the current density required for switching between different resistance states and thus, it is possible to improve the characteristics of the variable resistance element by lowering damping constant values.

The current density required for the above-described spin transfer toque is in proportion to the damping constant. Thus, if the damping constant of the free layer is low, the magnetization direction of the free layer can be easily changed even at a low current. In other words, a variable resistance element capable of operating even at a low driving current can be obtained. In this case, there is also an advantage in that the size of a selection element or the like that is connected to the variable resistance element can be reduced, making it possible to increase the integration density of a semiconductor memory including the variable resistance element and the selection element.

Figure 4:
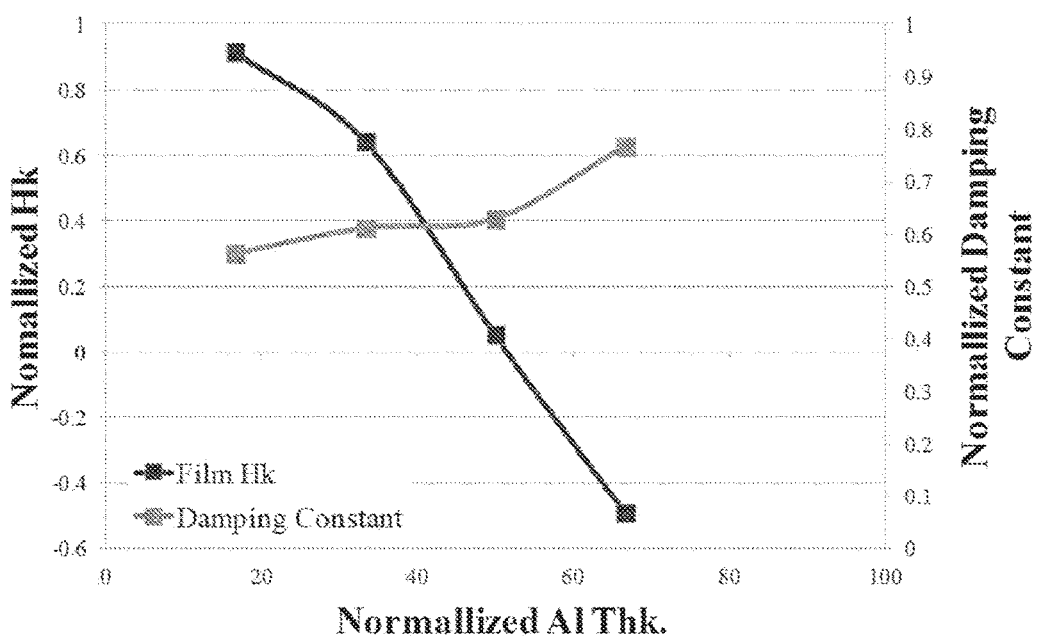
FIG. 4 is a graph showing the perpendicular anisotropy field (Hk) and damping constant values of a free layer according to an implementation of the disclosed technology.

FIG. 4 is a graph showing the perpendicular anisotropy field (Hk) and damping constant value of the free layer as a function of the Al content of the free layer of this implementation. In FIG. 4, the left y-axis represents normalized Hk values, and the right y-axis represents normalized damping constant values. As described below with reference to FIGS. 5A and 5B, the free layer according to this implementation may be formed by depositing a CoFeB layer and an Al layer and heat-treating the deposited layers to form a CoFeAlB alloy. In FIG. 4, the x-axis represents the normalized thickness of the Al layer, which is changed in a state in which the thickness of the CoFeB layer is fixed at a constant value.

Referring to FIG. 4, it can be seen that, if the thickness of the Al layer increases compared to that of the CoFeB layer, there is little or no change in the damping constant value. However, the Hk value greatly decreases as the thickness of the Al layer increases. Because an increase in the thickness of the Al layer means an increase in the content of Al in the CoFeAlB alloy, it can be seen that the ratio of the thickness of the Al layer to that of the CoFeB layer, that is, the content of Al in the CoFeAlB alloy, should be reduced to a certain level or less in order to satisfy both a desired Hk value and a desired damping constant value.

In FIG. 4, each of the two graphs has four dots. In below, dots are referred to as first to fourth dots along an X direction. The first dots at the leftmost side on two graphs indicate an Hk value and a damping constant value, respectively, when the thickness of the CoFeB layer is about 1.4 nm and the thickness of the Al layer is about 0.05 nm. In this case, the content of Al in the CoFeAlB alloy may be about 3-4%.

The second dots on two graphs indicate an Hk value and a damping constant value, respectively, when the thickness of the CoFeB layer is about 1.4 nm and the thickness of the Al layer is about 0.1 nm. In this case, the content of Al in the CoFeAlB alloy may be about 6-7%.

The third dots on two graphs indicate an Hk value and a damping constant value, respectively, when the thickness of the CoFeB layer is about 1.4 nm and the thickness of the Al layer is about 0.15 nm. In this case, the content of Al in the CoFeAlB alloy may be about 9-10%.

The fourth dots on two graphs indicate an Hk value and a damping constant value, respectively, when the thickness of the CoFeB layer is about 1.4 nm and the thickness of the Al layer is about 0.2 nm. In this case, the content of Al in the CoFeAlB alloy may be about 12-13%.

Taking the above-described experimental examples together, the content of Al in the CoFeAlB alloy may preferably be less than 10% in order to maintain both the damping constant value and the Hk value with their desired levels or ranges. This is because, if the content of Al in the CoFeAlB alloy is more than 10%, the Hk value can greatly decrease, which is undesirable. In some implementations, the content of Al in the CoFeAlB alloy may be more than 5% and less than 10%. This is because, as the content of Al increases, the damping constant value also slightly increases, although the damping constant value is substantially constant.

In this implementation, if the CoFeAlB alloy is used as the free layer and if the content of Al in the CoFeAlB alloy is controlled to be less than 10%, both a high perpendicular magnetic anisotropy and a low damping constant can be ensured. Thus, the storage characteristics and operating characteristics of the variable resistance element can be improved.

Referring back to FIG. 1, the variable resistance element 100 may further include, in addition to the MTJ structure, various layers for improving the characteristics of the MTJ structure or a process for forming the MTJ structure. For example, the variable resistance element 100 may further include a bottom layer 110, a spacer layer 150, a magnetic correction layer 160 and a capping layer 170.

The bottom layer 110 may be located between the MTJ structure, and may function to improve the characteristics of the MTJ structure. For example, the bottom layer 110 may have various crystalline structures so that it can function to improve the perpendicular magnetic crystalline anisotropy of a layer disposed on the bottom layer 110, for example, the free layer 120. This bottom layer 110 may have a single-layer or multilayer structure including metals, or metal nitrides, or a combination thereof.

If the bottom layer 110 functions to improve the perpendicular magnetic anisotropy of the free layer 120, the thickness of the bottom layer 110 can be reduced when the free layer including the CoFeAlB alloy as described in this implementation is used. Specifically, in the comparative example in which the free layer including the CoFeAlB alloy is formed on the bottom layer, the bottom layer should have a thickness equal to or larger than a certain level so that the free layer can function to improve the perpendicular magnetic anisotropy of the free layer. However, in the case of this implementation in which the free layer 120 including a CoFeAlB alloy is formed on the bottom layer 110, a perpendicular magnetic crystalline anisotropy similar to that of the comparative example can be satisfied even when the thickness of the bottom layer 110 is reduced compared to that of the bottom layer of the comparative example. The experimental results shown in FIG. 2A are obtained when the free layer including CoFeB of FIG. 2A was formed on a 0.8-nm-thick bottom layer including AlN. The experimental results shown in FIG. 2B are obtained when the free layer including CoFeAlB of FIG. 2B was formed on a 0.4-nm-thick bottom layer including AlN. From these results of FIGS. 2A and 2B, it can be seen that the present implementation of the disclosed technology allows to exhibit perpendicular magnetic anisotropy similar to that of the comparative example, even when the thickness of the bottom layer is reduced to half that of the comparative example while the bottom layer is made of the same material as that of the comparative example.

If the thickness of the bottom layer 110 decreases as described above, undesired electrical leakage caused by re-deposition of the material of the bottom layer 110 on the sidewall of the variable resistance element 100 in a patterning process for forming the variable resistance element 100 can be reduced. In addition, the etching time in the patterning process for forming the variable resistance element 100 can decrease, and thus, etching defects occurring in the sidewall of the variable resistance element 100 can decrease.

The magnetic correction layer 160 can function to offset or reduce the effect of the stray magnetic field produced by the pinned layer 140 at or on the free layer 120. In this case, the effect of the stray magnetic field of the pinned layer 140 on the free layer 120 can decrease, and thus a deflection magnetic field in the free layer 120 can decrease. The magnetic correction layer 160 may have a magnetization direction antiparallel to the magnetization direction of the pinned layer 140. In this implementation, if the pinned layer 140 has a downward magnetization direction, the magnetic correction layer 160 may have an upward magnetization direction. On the contrary, if the pinned layer 140 has an upward magnetization direction, the magnetic correction layer 160 may have a downward magnetization direction. The magnetic correction layer 160 may have a single-layer or multilayer structure including a ferromagnetic material.

Although the magnetic correction layer 160 in this implementation is located above the pinned layer 140, the position of the magnetic correcting layer 160 may be changed in various ways. For example, the magnetic correction layer 160 may be located below the MTJ structure. Alternatively, for example, the magnetic correction layer 160 may be located above, below or beside the MTJ structure while it is patterned separately from the MTJ structure.

The spacer layer 150 may be sandwiched between the magnetic correction layer 160 and the pinned layer 140 so that it can function as a buffer between them and to improve the characteristics of the magnetic correction layer 160. The spacer layer 150 may include a noble metal such as Ru.

The capping layer 170 functions as a hard mask in a patterning process for forming the variable resistance element 100, and may include various electrically conductive materials such as metals. For example, the capping layer 170 may be formed of a metal-based material that causes less pinhole defects in the layer and that has high resistance to wet and/or dry etching. For example, the capping layer 170 may include a noble metal such as Ru.

Meanwhile, the free layer 120 including the CoFeAlB alloy may be formed by various methods, and these methods will now be described by way of example with reference to FIGS. 5A and 5B.

Figure 5A:
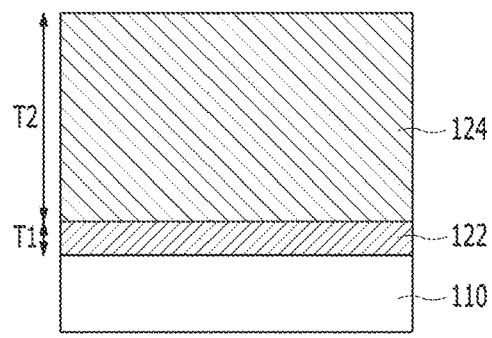
FIG. 5A is a cross-sectional view illustrating an example of a method for fabricating the free layer shown in FIG. 1.
Figure 5B:
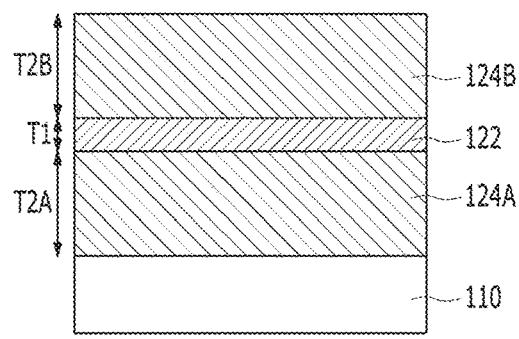
FIG. 5B is a cross-sectional view illustrating another example of a method for fabricating the free layer shown in FIG. 1.

FIG. 5A is a cross-sectional view illustrating an example of a method for fabricating the free layer shown in FIG. 1, and FIG. 5B is a cross-sectional view illustrating another example of a method for fabricating the free layer shown in FIG. 1.

Referring to FIG. 5A, an Al layer 122 having a first thickness T1 may be deposited on a bottom layer 110. Then, on the Al layer 122, a CoFeB layer 124 having a second thickness T2 greater than the first thickness T1 may be deposited. Next, a heat-treatment process may be performed to react the Al layer 122 with the CoFeB layer 124, thereby forming a CoFeAlB alloy. The ratio of the first thickness T1 to the second thickness T2 may be controlled such that the content of Al in the CoFeAlB will be less than 10%. For example, the ratio of the first thickness T1:the second thickness T2 may be controlled to be less than about 1:9.

As another example, although not shown in the figures, the CoFeAlB may also be formed by depositing the CoFeB layer 124 on the bottom layer 110, forming the Al layer 122 on the CoFeB layer 124, and then subjecting the deposited layers to a heat-treatment process.

Referring to FIG. 5B, the CoFeAlB alloy may also be formed by sequentially depositing a first CoFeB layer 124A, an Al layer 122 and a second CoFeB layer 124B on the bottom layer 110, and then subjecting the deposited layer to a heat-treatment process. Herein, the sum of the thickness T2A of the first CoFeB layer 124A and the thickness T2B of the second CoFeB layer 124B may be substantially the same as the second thickness T2 shown in FIG. 5A.

As another example, although not shown in the figures, the CoFeAlB alloy may also be formed by alternately depositing a plurality of CoFeB layers and a plurality of Al layers, and then subjecting the deposited layers to a heat-treatment process.

As still another example, although not shown in the figures, the CoFeAlB alloy may also be formed by a physical vapor deposition process using a CoFeAlB alloy target, for example, a sputtering process.

As still another example, although not shown in the figures, the CoFeAlB alloy may also be formed by a physical vapor deposition process using a CoFeB target and an Al target, for example, a co-sputtering process.

A plurality of variable resistance elements 100 as described above may be arranged to form a semiconductor memory. The semiconductor memory may further include various components, including lines and elements for deriving both ends of each variable resistance element 100. This semiconductor memory device will now be described by way of example with reference to FIGS. 6A and 6B.

Figure 6A:
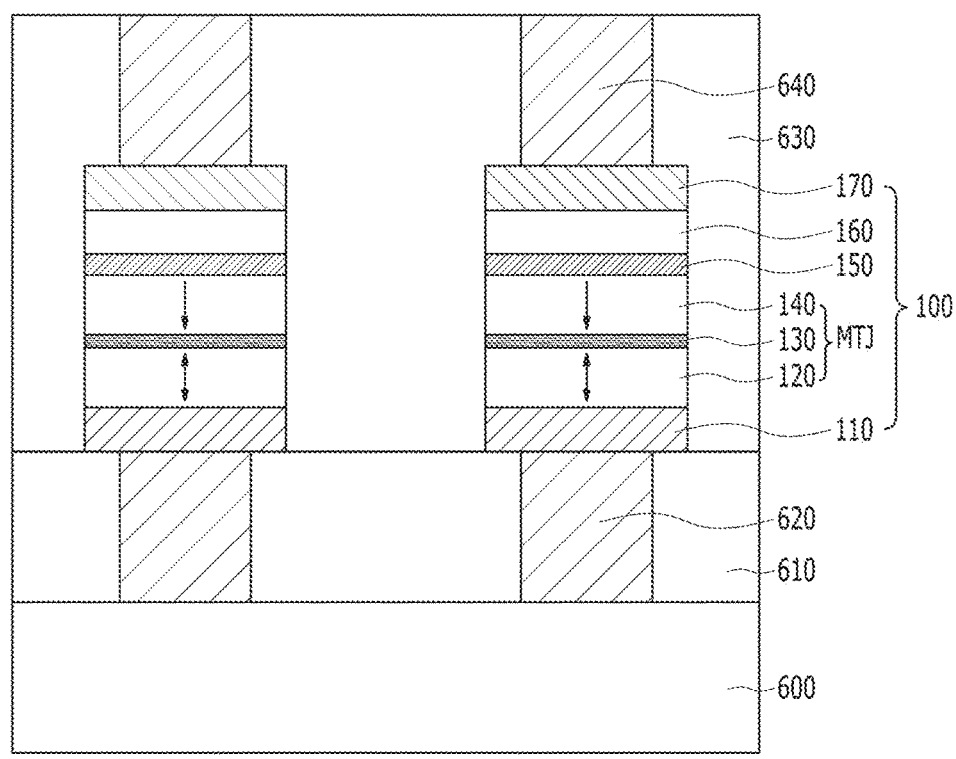
FIG. 6A is a cross-sectional view illustrating a memory device according to an implementation of the disclosed technology and a method for fabricating the same.

FIG. 6A is a cross-sectional view illustrating a memory device according to an implementation of the disclosed technology and a method for fabricating the same.

Referring to FIG. 6A, the memory device according to this implementation may include: a substrate 600 having formed therein a certain required element (not shown), for example, a transistor for controlling access to the variable resistance element 100; a bottom contact 610 located on the substrate 600 and connecting the lower end of each of a plurality of variable resistance elements 100 to a portion of the substrate 100, for example, the drain of the transistor; a variable resistance element 100 located on each of the bottom contact 620; and a top contact 640 located on each of the plurality of variable resistance elements 100 and connecting the top end of each of the plurality of variable resistance elements 100 to a certain line (not shown), for a bit line.

The memory device as described above may be formed by the following method.

First, a substrate having formed therein a transistor or the like may be provided, and then a first interlayer insulating layer 610 may be formed on the substrate 600. Next, the first interlayer insulating layer 610 may be selectively etched to form a hole exposing a portion of the substrate 600, after which an electrically conductive material may be filled in the hole to form a bottom contact 620. Thereafter, material layers forming a variable resistance element 100 may be formed over the lower contact 620 and the first interlayer insulating layer 610, and then these material layers may be selectively etched, thereby forming a variable resistance element 100. Herein, etching of the material layers for forming the variable resistance element 100 may be performed using a process having a strong physical etching property, such as an ion beam etching (IBE) process. Next, a second interlayer insulating layer 630 covering the variable resistance element may be formed. Following this, the second interlayer insulating layer 630 may be selectively etched to form a hole exposing the top surface of the variable resistance element 100, and then an electrically conductive material may be filled in the hole to form a top contact 640.

In the memory device according to this implementation, all the layers forming the variable resistance element 100 may have sidewalls aligned with one another. This is because the variable resistance element 100 is formed by an etching process using a single mask.

However, unlike the implementation shown in FIG. 6A, a portion of the variable resistance element 100 may be patterned separately from the other portion. This patterning process is illustrated in FIG. 6B.

Figure 6B:
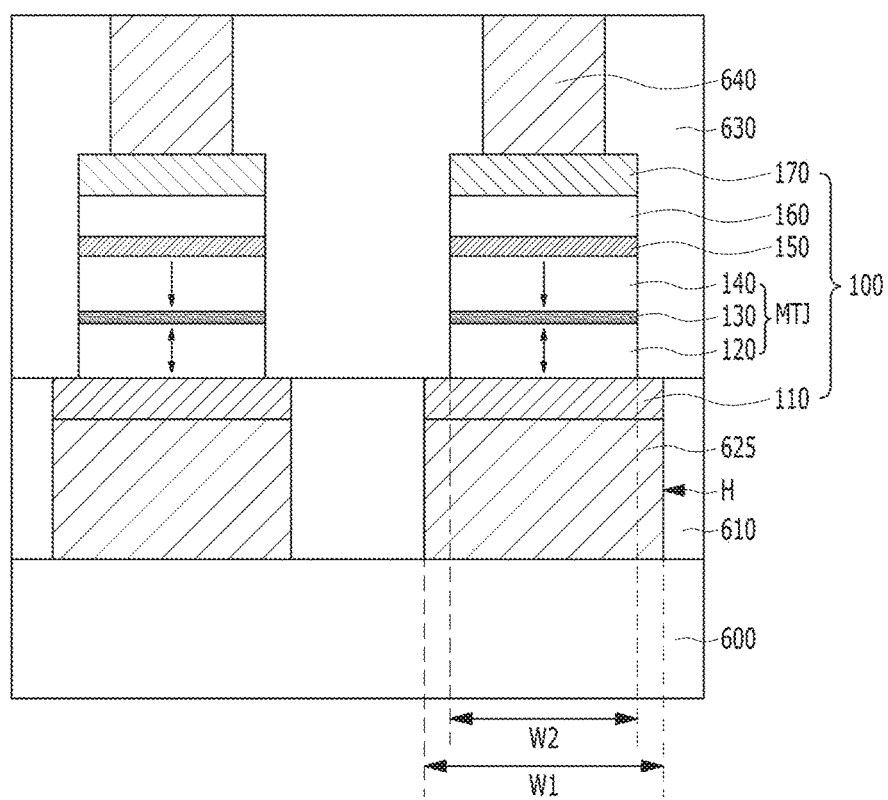
FIG. 6B is a cross-sectional view illustrating a memory device according to an implementation of the disclosed technology and a method for fabricating the same.

FIG. 6B is a cross-sectional view illustrating a memory device according to another implementation of the disclosed technology and a method for fabricating the same. The description of the implementation shown in FIG. 6B will be made on a focus on the difference from the implementation shown in FIG. 6A.

Referring to FIG. 6B, in the memory device according to this implementation, a portion of a variable resistance 100, for example, a bottom layer 110, may not have a sidewall aligned with those of the remaining layers. The bottom layer 110 may have a sidewall aligned with the sidewall of a bottom contact 625.

The memory device as shown in FIG. 6B may be formed by the following method.

First, a first interlayer insulating layer 610 may be formed on a substrate 600, and then the first interlayer insulating layer 610 may be selectively etched to form a hole H exposing a portion of the substrate 600. Next, a bottom contact 625 filling the lower portion of the hole H may be formed. More specifically, the bottom contact 625 may be formed by depositing an electrically conductive material covering the structure having the hole H formed therein, and then removing a portion of the electrically conductive material by an etch-back process or the like until the electrically conductive material reaches a desired height. Next, a bottom layer 110 filling the remaining space of the hole H having the bottom contact 625 formed therein may be formed. More specifically, formation of the bottom layer 110 may be performed by forming a material layer for the bottom layer 110, which covers the resulting structure having the bottom contact 625 formed therein, and then performing a polarization process, for example, a CMP (chemical mechanical polishing) process, until the top surface of the first interlayer insulating layer 610 is exposed. Next, material layers for forming the remaining layers other than the bottom layer 110 of the variable resistance element 100 may be formed on the bottom layer 110 and the first interlayer insulating layer 610, and then these material layers may be selectively etched, thereby forming the remaining portion of the variable resistance element 100. Subsequent processes are substantially the same as those described above with reference to FIG. 6A.

According to this implementation, the thickness to be etched by the etching process for forming the variable resistance element 100 can be reduced, and thus the difficulty in the etching process can be reduced.

In addition, although this implementation describes the case in which the bottom layer 110 is filled in the hole H, another layer, for example, the free layer 120, may further be filled in the hole H, if necessary.

Furthermore, in this implementation, the width W1 of the top surface of the bottom layer 110 may be equal to or larger than the width W2 of the bottom surface of the MTJ structure. Thus, the whole of the MTJ structure can exist over the bottom layer 110. If the width W1 of the top surface of the bottom layer 110 is smaller than the width W2 of the bottom surface of the MTJ structure, the MTJ structure will be located on the boundary between the bottom layer 110 and the interlayer insulating layer 610, and thus failure caused by bending of a portion of the MTJ structure can occur. For example, if the tunnel barrier layer 130 of the MTJ structure is bent, the characteristics of the MTJ structure can be deteriorated by neel coupling. However, in this implementation, such problems can be prevented, because the MTJ structure is formed on a highly planarized surface.

As described above, according to the electronic device including the semiconductor memory in accordance with the implementations of the disclosed technology, and the method for fabricating the same, the characteristics of the variable resistance element can be improved.

The above and other memory circuits or semiconductor devices based on the disclosed technology can be used in a range of devices or systems. FIGS. 7-11 provide some examples of devices or systems that can implement the memory circuits disclosed herein.

Figure 7:
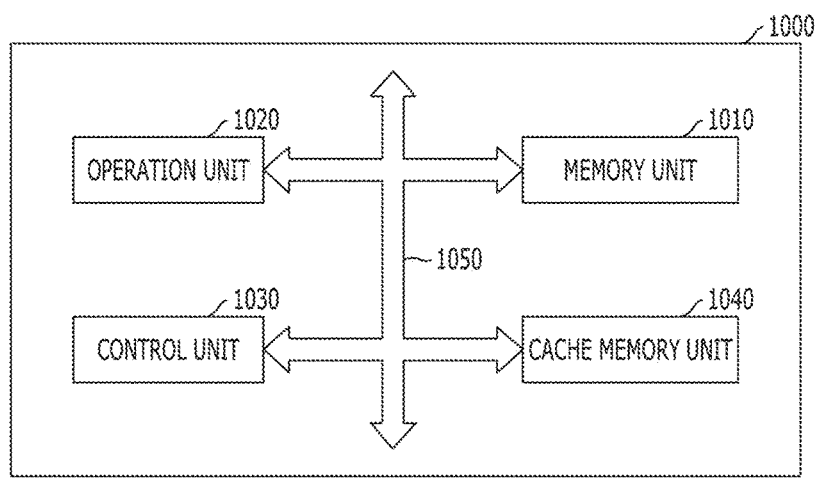
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, the microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a magnetic tunnel junction (MTJ) structure comprising: a free layer having a changeable magnetization direction; a pinned layer having a pinned magnetization direction; and a tunnel barrier layer sandwiched between the free layer and the pinned layer, wherein the free layer comprises a CoFeAlB alloy. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
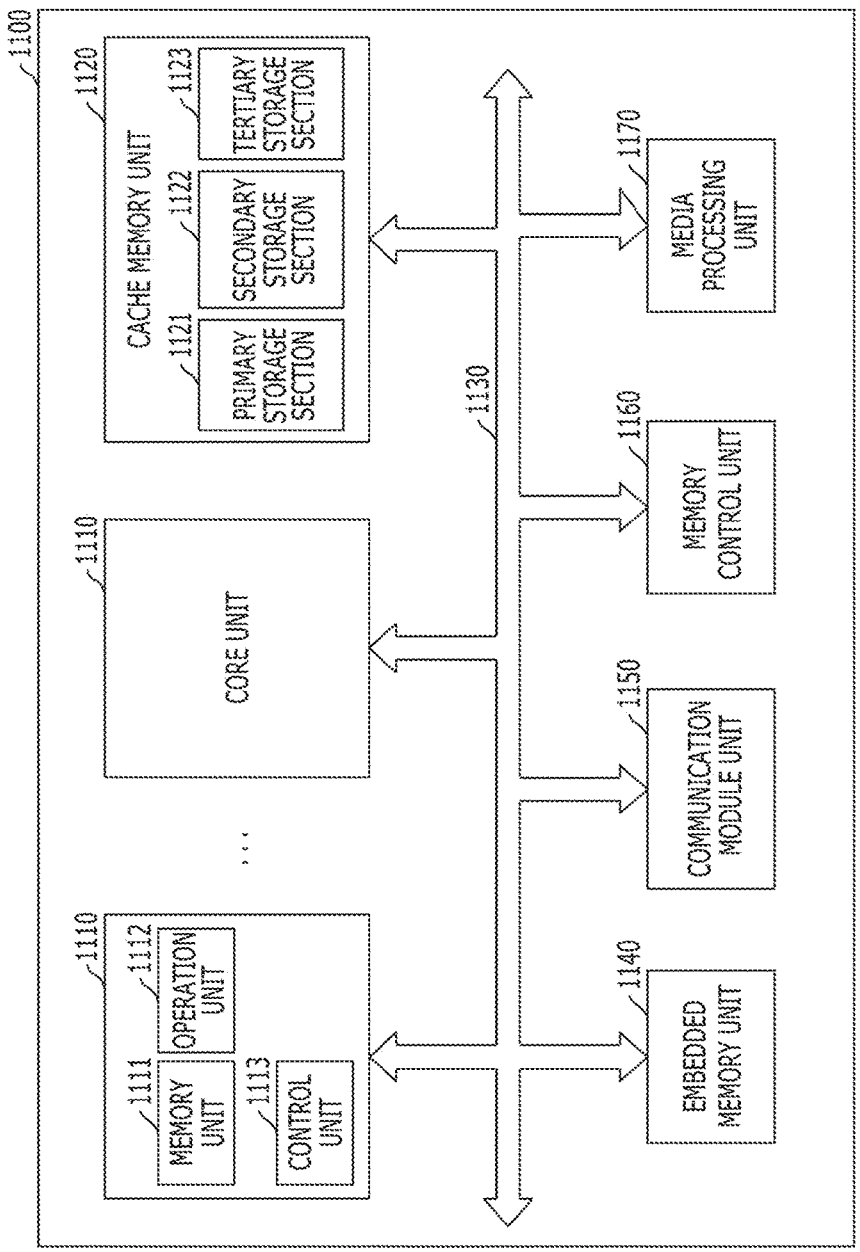
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a magnetic tunnel junction (MTJ) structure comprising: a free layer having a changeable magnetization direction; a pinned layer having a pinned magnetization direction; and a tunnel barrier layer sandwiched between the free layer and the pinned layer, wherein the free layer comprises a CoFeAlB alloy. Through this, data storage characteristics of the cache memory unit 1120 may be improved. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
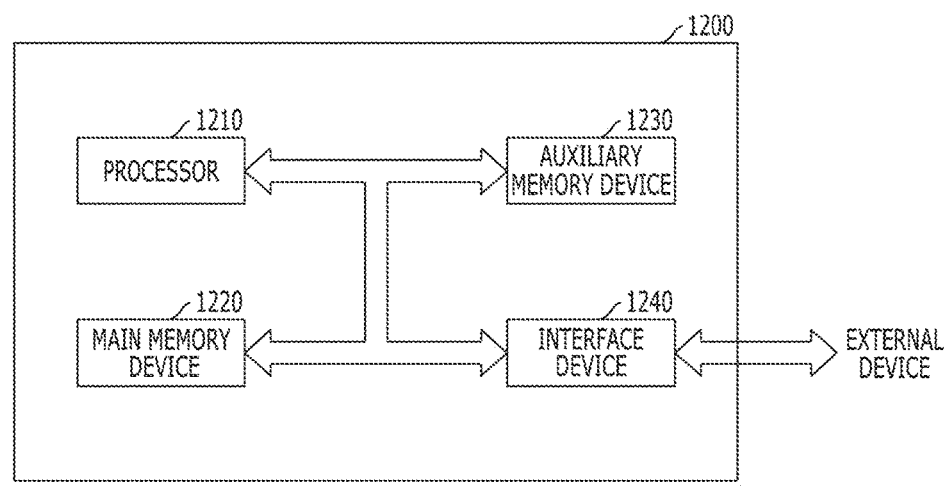
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a magnetic tunnel junction (MTJ) structure comprising: a free layer having a changeable magnetization direction; a pinned layer having a pinned magnetization direction; and a tunnel barrier layer sandwiched between the free layer and the pinned layer, wherein the free layer comprises a CoFeAlB alloy. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a magnetic tunnel junction (MTJ) structure comprising: a free layer having a changeable magnetization direction; a pinned layer having a pinned magnetization direction; and a tunnel barrier layer sandwiched between the free layer and the pinned layer, wherein the free layer comprises a CoFeAlB alloy. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
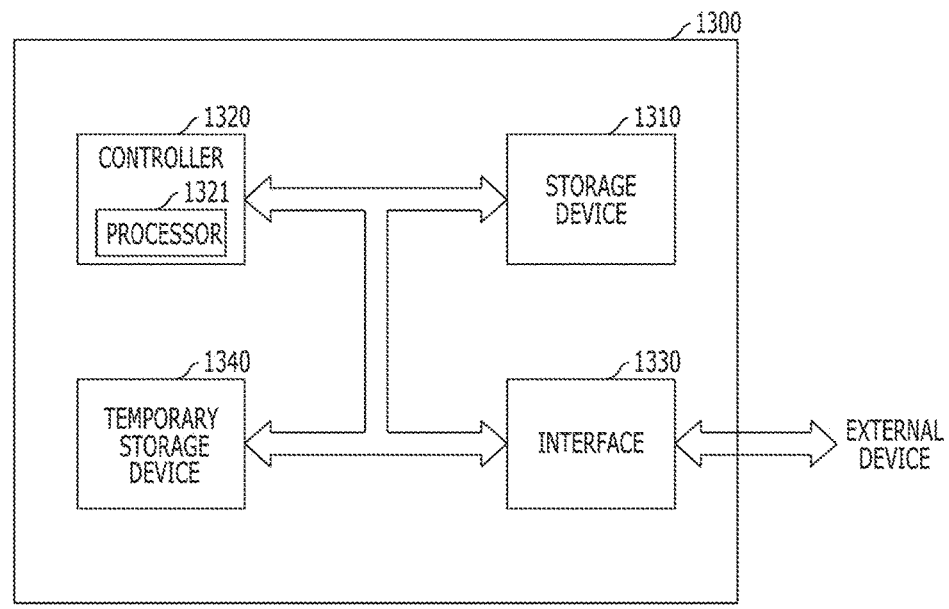
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a magnetic tunnel junction (MTJ) structure comprising: a free layer having a changeable magnetization direction; a pinned layer having a pinned magnetization direction; and a tunnel barrier layer sandwiched between the free layer and the pinned layer, wherein the free layer comprises a CoFeAlB alloy. Through this, data storage characteristics of the temporary storage device 1340 may be improved. As a consequence, operating characteristics and data storage characteristics of the data storage system 1300 may be improved.

Figure 11:
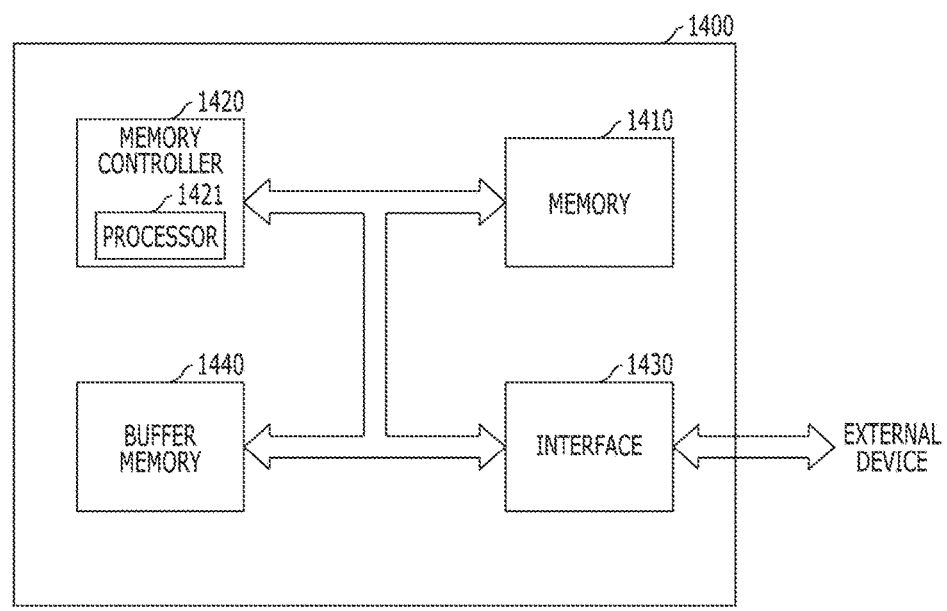
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a magnetic tunnel junction (MTJ) structure comprising: a free layer having a changeable magnetization direction; a pinned layer having a pinned magnetization direction; and a tunnel barrier layer sandwiched between the free layer and the pinned layer, wherein the free layer comprises a CoFeAlB alloy. Through this, data storage characteristics of the memory 1410 may be improved. As a consequence, operating characteristics and memory characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a magnetic tunnel junction (MTJ) structure comprising: a free layer having a changeable magnetization direction; a pinned layer having a pinned magnetization direction; and a tunnel barrier layer sandwiched between the free layer and the pinned layer, wherein the free layer comprises a CoFeAlB alloy. Through this, data storage characteristics of the buffer memory 1440 1010 may be improved. As a consequence, operating characteristics and memory characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
   wherein the semiconductor memory includes a magnetic tunnel junction (MTJ) structure which includes: a free layer having a changeable magnetization direction; a pinned layer having a pinned magnetization direction; and a tunnel barrier layer sandwiched between the free layer and the pinned layer,
   wherein the free layer comprises a CoFeAlB alloy, and a content of Al in the CoFeAlB alloy is less than 10%.

2. The electronic device of claim 1, wherein the content of Al in the CoFeAlB alloy is 5% or more.

3. The electronic device of claim 1, wherein the semiconductor memory further comprises a bottom layer disposed under the MTJ structure and serving to increase a perpendicular magnetic crystalline anisotropy of the free layer or the pinned layer.

4. The electronic device of claim 3, wherein the bottom layer comprises AlN.

5. The electronic device of claim 1, wherein the semiconductor memory further comprises a magnetic correction layer that reduces an effect of a stray magnetic field produced by the pinned layer.

6. The electronic device of claim 5, wherein the magnetic correction layer is disposed over the MTJ structure.

7. The electronic device of claim 6, wherein the semiconductor memory further comprises a spacer layer sandwiched between the MTJ structure and the magnetic correction layer and comprising a noble metal.

8. The electronic device of claim 1, wherein the semiconductor memory further comprises one or more layers disposed over or under the MTJ structure and having a sidewall aligned with a sidewall of the MTJ structure.

9. The electronic device of claim 3, wherein a sidewall of the bottom layer is not aligned with a sidewall of the MTJ structure.

10. The electronic device of claim 9, wherein a width of a top surface of the bottom layer is larger than a width of a bottom surface of the MTJ structure.

11. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

12. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

13. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

14. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

15. The electronic device according to claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

* * * * *